United States Patent [19]

Langham

[11] 4,226,496

[45] Oct. 7, 1980

[54] CIRCUIT BOARD EDGE CONNECTOR

[75] Inventor: Arvin L. Langham, Canoga Park, Calif.

[73] Assignee: Elfab Corporation, Dallas, Tex.

[21] Appl. No.: 898,635

[22] Filed: Apr. 21, 1978

Related U.S. Application Data

[62] Division of Ser. No. 384,776, Aug. 9, 1973, Pat. No. 4,094,573.

[51] Int. Cl.[3] .......................... H01R 13/42; H05K 1/07

[52] U.S. Cl. ........................... 339/176 MP; 339/217 S

[58] Field of Search ........... 339/176 MP, 17 L, 217 S

[56] References Cited

U.S. PATENT DOCUMENTS 2,908,775 10/1959 Gilbert ................................ 339/17 L 3,289,148 11/1966 Antes ............................ 339/176 MP

FOREIGN PATENT DOCUMENTS 1070574 6/1967 United Kingdom ............. 339/176 MP

*Primary Examiner*—Neil Abrams

*Attorney, Agent, or Firm*—Crisman & Moore

[57] ABSTRACT

An edge connector for a circuit board includes a plurality of contact terminals each having a contact head, each contact head having a loop portion. The contact terminals are supported in a cavity in an insulative housing in such relation that the loop portion of the contact head bears against a shoulder portion of the housing. In one form of the connector, the contact terminals are fixedly mounted in a mounting substrate in such an arrangement that the loop portion of the contact heads bias the insulative housing against the substrate to hold the assemblage. In another form of the connector, the substrate may be eliminated, and the contacts include a lower flange portion adapted to bear against lower surface of the housing and an upper tongue portion adapted to bear against an upper shoulder surface of the housing between the tongue portion and the flange portion.

17 Claims, 7 Drawing Figures

CIRCUIT BOARD EDGE CONNECTOR

This is a division of application Ser. No. 384,776, filed Aug. 9, 1973 now U.S. Pat. No. 4,094,573 issued on June 13, 1978.

This invention relates to edge connectors for printed circuit boards, and particularly to connector systems for establishing electrical contact between edge contact terminals of a printed circuit board and other electric circuits.

Heretofore, printed circuit board connectors included an elongated contact portion having a contact head at one end thereof for contact against a terminal on the printed circuit board. The elongated contact portion was fixedly attached to a bottom wall of an insulative housing so that the head portion extended into a cavity in the insulative housing, the housing having a slot for receiving a printed circuit board. Thereafter the elongated contact portion of the connectors extending through the bottom of the insulative housing was assembled to a supporting substrate through suitable apertures in the substrate. One problem associated with such prior connectors resided in the fact that minor misalignment between the position of the contacts in the insulative housing and the apertures in the supporting substrate often caused damage to the contact terminals during assemblage of the supporting substrate to the elongated contact portions.

In U.S. Pat. No. 3,671,917, there is described a connector manufactured by first press-fitting the contact terminals into the receiving substrate or mounting board and thereafter attaching the insulative housing over the contact terminals. The contact terminals described in the aforementioned Letters Patent include shoulder portions adapted to engage opposite side walls of the insulative housing in an interference fit. However, misalignment of the contacts fitted to the mounting substrate resulted in damage to the contacts when interference fitted to the insulative housing.

It is an object of the present invention to provide an edge connector for a printed circuit board wherein the connector is latched to the insulative housing.

Another object of the present invention is to provide an edge connector for a printed circuit board which is attached to an insulative housing by a latch, and without an interference fit.

An edge connector according to the present invention includes a contact having a portion adapted to latch against a member of an insulative housing to thereby restrain the insulative housing from disassemblage. It will be appreciated that the contact terminals are not interference fitted to the insulative housing, thereby resulting in a connector more easily manufactured, at less cost, and with higher reliability.

According to one form of the invention, the contact terminals are first interference fitted to a supporting substrate and thereafter assembled to the insulative housing, the arrangement being such that the housing is biased against the substrate by the contacts.

In accordance with a modification of the present invention, the mounting substrate may be eliminated, and a tongue and flange arrangement is provided on a contact terminal to sandwich a portion of the insulative housing there-between so that the contact is entirely supported by the housing.

The above and other features of this invention will be more fully understood from the following detailed description and the accompanying drawings, in which.

Figure 2:
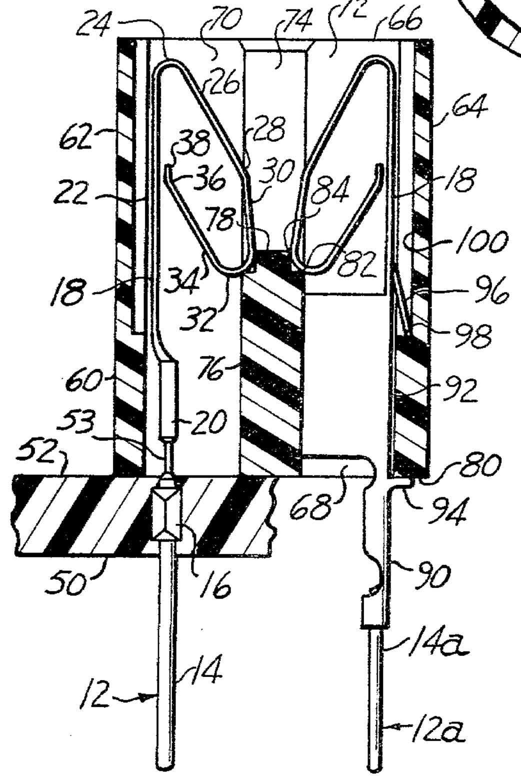
FIG. 2 is a side view elevation, partly in cut-away cross-section, of the connector illustrated in FIG. 1.
Figure 4:
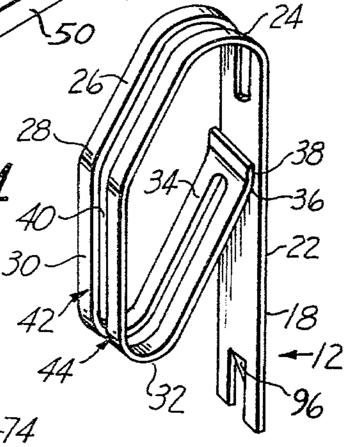
FIG. 4 is a perspective view of a portion of the contact terminal for use in the connector according to the present invention.
Figure 3:
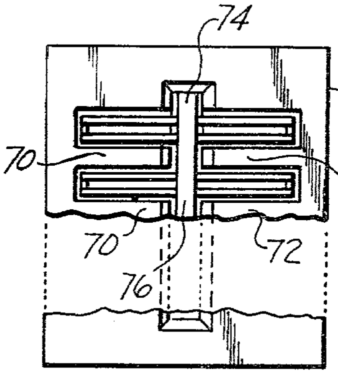
FIG. 3 is a partial top view of the connector illustrated in FIG. 2.

Referring to the drawings, there is illustrated an edge connector 10 in accordance with the presently preferred embodiment of the present invention. Particularly, the connector includes a plurality of contacts 12 having an elongated shank portion 14 and an enlarged portion 16 of irregular cross-section. A relatively flat portion 18 extends upwardly from a shank portion 20 (as illustrated in FIG. 2) and includes, sequentially, a first relatively straight portion 22, a curved portion 24, a second relatively straight portion 26 extending downwardly and outwardly from portion 22, a second curved portion 28, a third relatively straight portion 30 extending substantially downwardly, a third curved portion 32, an upwardly and inwardly directed relatively straight portion 34 disposed substantially parallel to portion 26, a curved portion 36, and a terminating end portion 38 disposed substantially parallel to portion 22. As will be more fully understood hereinafter, portions 22 and 38 may or may not be touching each other. Preferably and as illustrated particularly in FIG. 4, a slot 40 extends along the length of flat portion 18 from a location near the end of portion 22 through portion 34. Slot 40 forms a pair of resilient arms 42 and 44 which form a somewhat elliptically-shaped torroid forming a bifurcated bellows loop contact head for establishing electrical contact with edge contact terminals on a printed circuit board.

Figure 1:
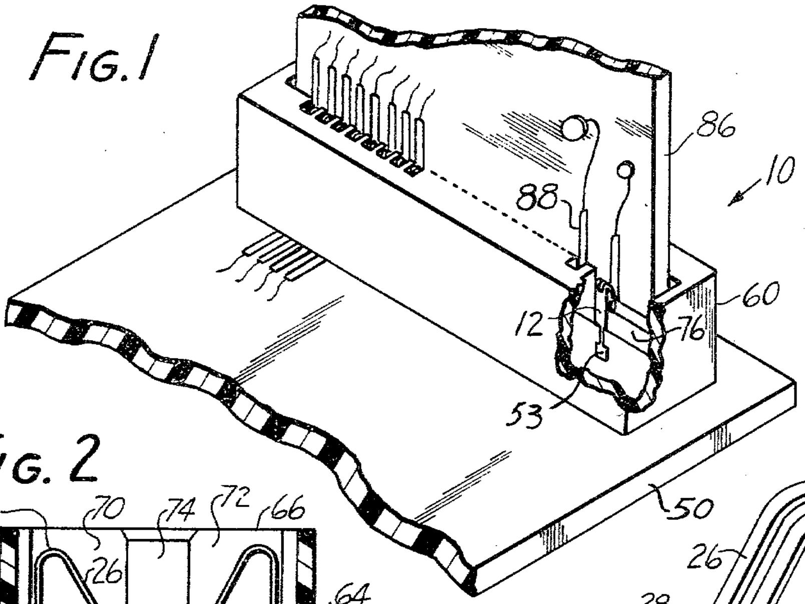
FIG. 1 is a perspective view of a connector in accordance with the presently preferred embodiment of the present invention.

Contact 12 is assembled to a substrate or mounting board 50 by an interference fit through a suitable aperture (not shown) from a top surface 52 thereof so that the portion 16 is interference-fit into such aperture. Preferably, an enlarged flat portion 53 is provided on contact 12 between shank portion 20 and portion 16 to form a stop against which the upper surface 52 of board 50 may bear to accurately position the contact with respect to the board (see FIG. 1).

Insulative housing 60 is assembled over the contact portions 18. Housing 60 includes longitudinal side walls 62 and 64 which are open at their upper ends 66 and their lower ends 68. Separate contact cavities are formed between adjacent internal walls 70 and 72, the internal walls having an elongated slot 74 disposed therebetween. Housing 60 further includes a member 76 extending upwardly from the bottom of the housing and between the ends of housing 60 and between walls 70 and 72 to form a bottom terminous for slot 74. Member 76 includes a recessed portion defining an upper surface 78 of member 76 and a slotted portion defined by elongated edge portions 82 and 84.

As shown particularly in FIG. 2, the width of slot 74 is approximately the same as the width of member 76, while the width of upper surface 78 is somewhat smaller. In a typical application, for example, the width of slot 74 and member 76 may be approximately 0.075 inch, whereas the width of surface 78 may be about 0.055 inch. Thus, the inner-most surfaces of the loop contact head will be spaced apart by about 0.055 inch, and, due to their compression, will bear against portion 84. Hence, a printed circuit board having a width of about 0.062 inch will spread the contact heads apart so as to further compress the heads to maintain electrical contact between the heads and a portion of the board.

Figure 5A:
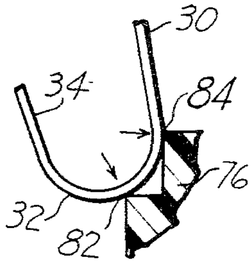
FIGS. 5A–5C are enlarged section views of a portion of the contact terminal engaging the insulative housing showing the manner by which the contacts latch against the insulative housing in various operational conditions of the connector.
Figure 5B:
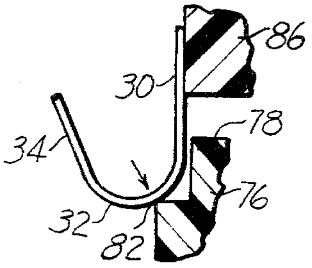

As shown particularly in FIG. 5A, when insulative housing 60 is assembled to the contacts, curved portion 32 of the contact loops bear against edge portions 82 and 84 of member 76 thereby biasing housing 60 against surface 52 of substrate 50 to restrain the housing from relative movement. The substantially elliptically shaped loop head portion of each contact is compressed along its minor axis against portion 84. When printed circuit board 86 having edge contacts 88 disposed thereon (by suitable techniques, such as plating) is inserted into slot 74, the board bears against portion 30 of contact 12 to compress the bellows loop portion of the connector, as shown in FIG. 5B. Circuit board 86 may be fully assembled to the connector by bringing the board to rest against the upper surface 78 of member 76 so that portion 30 of connector 12 engages the plated contact 88 on the circuit board.

Figure 5C:
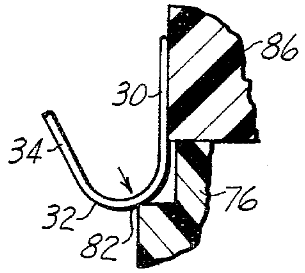

It will be appreciated that at all positions of the bellows contact, curved portion 32 thereof bears against edge portion 82 of member 76 to continue to restrain housing 60 in position. In this respect it should be noted that the loop bellows head portion of the contact compresses along the minor axis of the ellipse formed by the loop, while the location of the major axis of the ellipse does not change appreciably. Thus, a bias force is exerted by contact 12 against member 76 along the direction of the arrows shown in FIGS. 5A–5C for all operational conditions of the connector to hold the assemblage together. Thus, the bias force against the member 76 biases housing 60 against upper surface 52 of substrate 50, and the contact heads are latched to member 76. The bias force is propagated along the major axis of the elliptically shaped loop regardless of changes along the minor axis due to compression.

Referring to FIG. 2, there is illustrated a modification of the present invention utilizing bellows type contacts self-supported by housing 60. The upper portion of contacts 12*a* is identical to bellow portion 18 of contact 12. The lower portion, however, includes an elongated contact 14*a* fixedly attached to portion 90 of body 92. Body 92, from which portion 18 extends, includes a flange 94 adapted to engage against lower surface 80 of housing 60. A resilient tongue 96 extends outwardly and downwardly from portion 18 to engage shoulder 98 of recess 100 in housing 60. Thus, with a contact such as 12*a* assembled to housing 60, the contact is nested in the contact cavity so that tongue 96 of the contact bears against shoulder 98 while flange 94 bears against surface 80 to hold the assemblage together.

To assemble the contacts to the insulative housing, in the case of contacts 12 shown in the left-hand portion of FIG. 2 the contacts are interference-fitted to mounting substrate 50 as heretofore described. Thereafter, an insertion tool (not shown) comprising a board having dimensions approximately equal to slot 74 is inserted into slot 74 of housing 60 and the housing is slid over the contacts. The insertion tool bears against the contact heads thereby compressing them to enable the housing to be fully assembled in place. Thereafter the insertion tool is removed allowing the contact heads to spread and bear against edge portions 82 and 84 and latch against member 76 in the position shown in FIG. 2. Disassemblage may be accomplished by re-inserting the insertion tool into slot 74 to compress the contact heads and thereafter removing the housing.

Contacts 12*a*, shown in the right-hand portion of FIG. 2, may be assembled to housing 60 merely by forcing the contacts from the bottom of the housing until the head expands to rest as shown in FIG. 2 and tongue 96 expands into recess 100. Flange 94 bears against lower surface 80 while tongue 96 bears against shoulder 98 to hold the assemblage together. Disassemblage may be accomplished by inserting a removal tool (not shown) into recess 100 to compress tongue 96 flush with portion 18 and by inserting the insertion board into slot 74 as described above to compress the contact head to thereby permit retraction of the contact through the bottom of the housing.

The present invention thus provides an edge connector for use with printed circuit boards, which connector is easily assembled, more dependable in manufacture, and yet rugged in use. In the case of contacts supported by a mounting board, the contacts are first assembled to an aperture in the mounting board and thereafter the insulative housing 60 is snapped over the contacts and held in place by the biasing effect of the contacts against a portion of the housing to hold the housing to the mounting board in a latching engagement. In the case of a contact not mounted to a mounting board, the contact bears against two portions of the insulative housing to support the contact within the housing. In either case, a printed circuit board is assembled to the connector by inserting an edge of the board into the slot 74 so that it bears against opposite bellow contacts 12, thereby spreading the contacts to make electrical connection between those contacts and plated contacts on the circuit board. The geometry, however, of the bellow contacts is such that the curved portions of the bellow loops continue to bear against the housing 60 to assure proper assemblage.

Substrate 50 may be a mounting board or, preferably, another printed circuit board. For example, board 50 may be a printed circuit board capable of establishing electrical contacts between a plurality of circuit boards connected thereto by separate connector systems according to the present invention. Additionally, board 50 may also support circuit elements.

This invention is not to be limited by the embodiments shown in the drawings and described in the description, which are given by way of example and not of limitation, but only in accordance with the scope of the appended claims.

What is claimed is:

1. An edge connector for a circuit board comprising: a plurality of contact terminals each having a contact head, each of said contact heads including a loop portion; an insulative housing comprising a shell having oppositely disposed outer longitudinal walls and a bottom surface, a member between each of said walls forming cavity means between said member and each respective outer wall, the bottom of each of said cavity means being open, said member having an upper surface portion facing upwardly into each of said cavity means, said shell having an opening above said member to receive a circuit board for insertion along a predetermined axis so that said contact heads establish electrical contact to respective portions on such circuit board, said upper surface portion being substantially normal to said predetermined axis; and mounting means fixedly positioning each respective contact terminal with respect to the bottom surface of said shell, said mounting means comprising flange means on each of said contact terminals, said flange means being in abutting engagement with said bottom surface of said shell; and each of said loop portions continuously engaging an edge of the upper surface portion of said member for all operational conditions of the connector to bias said housing against said mounting means.

2. A connector according to claim 1 wherein said shell includes a plurality of divider walls extending normal to said outer walls to form a plurality of individual cavities between adjacent divider walls and between said member and the respective outer walls, an individual one of said contact heads being positioned in each of said cavities, said opening being formed by a slot in said divider walls.

3. Apparatus according to claim 1 further including a shoulder portion on said shell facing each of said cavity means and a resilient tongue carried on each of said contact terminals engaging said shoulder portion.

4. A connector according to claim 1 further including a shoulder portion on said shell and tongue means carried by said terminals bearing against said shoulder portion to sandwich a portion of said shell between said tongue means and said flange means.

5. An edge connector for a circuit board comprising: a plurality of contact terminals each having a contact head and a body portion, each of said contact heads including a loop portion having an end portion means for bearing against an inner surface of another portion of said loop portion upon application of a compressive force to said loop portion; and an insulative housing comprising a shell having oppositely disposed outer longitudinal walls and a member between said walls, said shell having a plurality of divider walls extending normal to said outer walls to form individual cavities between said member and the respective outer wall and between adjacent divider walls, the bottom of each of said cavities being open, said member having a surface portion facing upwardly into each of said cavities, said contact terminals each having a flange portion engaging a lower surface of said housing, said shell having a slot formed between said divider walls to receive a circuit board for insertion along a predetermined axis so that said contact heads establish electrical contact to respective portions on said circuit board, said surface portion being substantially normal to said predetermined axis, said loop portions of said contact heads each including a portion bearing downwardly against an edge of said surface portion of said member to bias said housing against said flange portion, said loop portions engaging said member in latched relation.

6. A connector according to claim 5 wherein said loop portion has a substantially elliptically-shaped toroidal cross-section having its major axis extending nominally into said upper surface of said member, said loop portion being compressible along its minor axis upon assemblage of a circuit board to said connector without substantially changing the position of said major axis, said contact heads bearing against said upper surface of said member in a direction substantially coincident with said major axis.

7. Apparatus according to claim 5 further including a shoulder portion on said shell facing each of said cavities and a resilient tongue carried on each of said contact terminals engaging said shoulder portion.

8. A connector according to claim 5 further including a shoulder portion on said shell and tongue means carried by said terminals engaging said shoulder portion to sandwich a portion of said housing between said tongue means and said flange portion.

9. A connector according to claim 5 wherein said surface portion of said member is formed by a recess in said member at the upper end thereof, said recess having upwardly and sidewardly facing surfaces facing into each of said cavities, said portion on said loop portion engaging an edge of the upwardly facing surface of said recess, said portion on said loop portion also engaging the sidewardly facing surface of said recess to exert a compressive force on said loop portion, whereby contact heads in oppositely facing cavities are positioned apart by said sidewardly facing surfaces and said loop portions bear against respective edges of said upwardly facing surfaces of said recess to latch against said member.

10. A connector according to claim 6 wherein said surface portion of said member is formed by a recess in said member at the upper end thereof, said recess having upwardly and sidewardly facing surfaces facing into each of said cavities, said portion on said loop portion engaging an edge of the upwardly facing surface of said recess, said portion on said loop portion also engaging the sidewardly facing surface of said recess to exert a compressive force on said loop portion along said minor axis, whereby contact heads in oppositely facing cavities are positioned apart by said sidewardly facing surfaces and said loop portions bear against respective edges of said upwardly facing surfaces of said recess to latch against said member.

11. An edge connector for a circuit board comprising: a plurality of contact terminals each having a contact head; an insulative housing comprising a shell having oppositely disposed outer longitudinal walls and a bottom surface, a member between each of said walls forming cavity means between said member and each respective outer wall, the bottom of each of said cavity means being open, said member having an upper surface portion facing into each of said cavity means, said shell having an opening above said member to receive a circuit board so that said contact heads establish electrical contact to respective portions on said circuit board; and mounting means fixedly positioning each respective contact terminal with respect to the bottom surface of said shell; each of said contact terminals including means continuously engaging an edge of said upper surface portion for all operational conditions of the connector to continuously bias said housing against said mounting means and wherein said mounting means comprises flange means on each of said contact terminals with said flange means being in abutting engagement with said bottom surface of said shell.

12. A connector according to claim 11 wherein said shell includes a plurality of divider walls extending normal to said outer walls to form a plurality of individual cavities between adjacent divider walls and between said member and the respective outer walls, an individual one of said contact heads being positioned in each of said cavities, said opening being formed by a slot in said divider walls.

13. A connector according to claim 11 further including a shoulder portion on said shell facing each of said cavity means and a resilient tongue carried on each of said contact terminals engaging said shoulder portion.

14. A connector according to claim 11 further including a shoulder portion on said shell and tongue means carried by said terminals bearing against said shoulder portion to sandwich a portion of said shell between said tongue and said flange means.

15. An edge connector for a circuit board comprising: a plurality of contact terminals each having a contact head; and an insulative housing comprising a shell having oppositely disposed outer longitudinal walls and a member between said walls, said shell having a plurality of divider walls extending normal to said outer walls to form individual cavities between said member and the respective outer wall and between adjacent divider walls, the bottom of each of said cavities being open, said member having a surface portion facing upwardly into each of said cavities, said contact terminals each having a flange portion engaging a lower surface of said housing, said contact terminals each including a portion bearing against and edge of said surface portion of said member to bias said housing against said flange portion, said shell having a slot formed in said divider walls to receive a circuit board so that said contact heads establish electrical contact to respective portions on said circuit board.

16. An edge connector according to claim 15 further including a shoulder portion on said shell facing each of said cavities and a resilient tongue carried on each of said contact terminals engaging said shoulder portion.

17. An edge connector according to claim 15 further including a shoulder portion on said shell and tongue means carried by said contact terminals engaging said shoulder portion to sandwich a portion of said housing between said tongue means and said flange portion.

* * * * *